(12) United States Patent
Dall'Aglio et al.

(10) Patent No.: US 10,292,295 B2
(45) Date of Patent: May 14, 2019

(54) MEASURING AND/OR CHECKING SYSTEM INCLUDING AT LEAST TWO UNITS, AND METHOD TO MANAGE RELATIVE ELECTRICAL CONNECTIONS

(71) Applicant: Marposs Societa' Per Societa Azioni, Bentivoglio BO (IT)

(72) Inventors: Carlo Dall'Aglio, Castello D'Argile (IT); Michele Gulinelli, Ferrara (IT); Daniele Roversi, Bologna (IT)

(73) Assignee: Marposs Societa' Per Azioni, Bentivoglio (BO) (IT)

( * ) Notice: Subject to any disclaimer, the term of this patent is extended or adjusted under 35 U.S.C. 154(b) by 0 days.

(21) Appl. No.: 15/755,673

(22) PCT Filed: Aug. 31, 2016

(86) PCT No.: PCT/EP2016/070462
§ 371 (c)(1),
(2) Date: Feb. 27, 2018

(87) PCT Pub. No.: WO2017/037090
PCT Pub. Date: Mar. 9, 2017

(65) Prior Publication Data
US 2019/0029138 A1    Jan. 24, 2019

(30) Foreign Application Priority Data

Aug. 31, 2015  (IT) .................. 102015000047322

(51) Int. Cl.
*H05K 7/14* (2006.01)
*H01R 9/24* (2006.01)
*H01R 31/08* (2006.01)

(52) U.S. Cl.
CPC ......... *H05K 7/1478* (2013.01); *H01R 9/2458* (2013.01); *H01R 31/08* (2013.01);
(Continued)

(58) Field of Classification Search
None
See application file for complete search history.

(56) References Cited

U.S. PATENT DOCUMENTS 4,950,178 A * 8/1990 Harvey .................. H01R 31/08
439/247
6,704,815 B1 * 3/2004 Morikawa ............ H01R 9/2675
700/19

(Continued)

FOREIGN PATENT DOCUMENTS

| DE | 101 17 758 A1 | 11/2002 |
|---|---|---|
| DE | 10 2013 112 101 A1 | 5/2015 |
| EP | 1 511 054 A1 | 3/2005 |

*Primary Examiner* — Xanthia C Cunningham
(74) *Attorney, Agent, or Firm* — Blank Rome LLP

(57) ABSTRACT

A measuring and/or control system (1), to control for example a machine tool, comprises at least a first and a second unit, each comprising a casing with a front wall, electronic circuits and at least one socket. The system further comprises a bridge connector (11) having a first multipolar connector (11A) and a second multipolar connector (11B), each of which can be coupled to one of the sockets in order to electrically connect the first and the second unit. In each of the first unit and second unit, the socket is positioned on the respective front wall and comprises planar electrical contacts. The first and the second multipolar connectors of the bridge connector are directed in the same direction so as to face the front wall of the first unit and the second unit and each comprise retractable contacts. The bridge connector comprises fastening elements for fastening the bridge connector to the front wall of the first unit and of the second unit.

14 Claims, 9 Drawing Sheets

(52) U.S. Cl.
CPC ......... *H05K 7/1465* (2013.01); *H05K 7/1468* (2013.01); *H05K 7/1474* (2013.01)

(56) References Cited

U.S. PATENT DOCUMENTS

| | | | |
|---|---|---|---|
| 6,780,064 B2* | 8/2004 | Abel | H01R 13/005 439/507 |
| 6,843,684 B2* | 1/2005 | Milan | G06F 13/4095 439/511 |
| 9,755,384 B2* | 9/2017 | Bury | H01R 9/26 |
| 2002/0098719 A1* | 7/2002 | Reimund | H01R 25/006 439/61 |
| 2005/0037673 A1 | 2/2005 | Verstraete et al. | |
| 2010/0103627 A1* | 4/2010 | Nelson | G05B 19/0421 361/730 |
| 2016/0286679 A1 | 9/2016 | Bury et al. | |

* cited by examiner

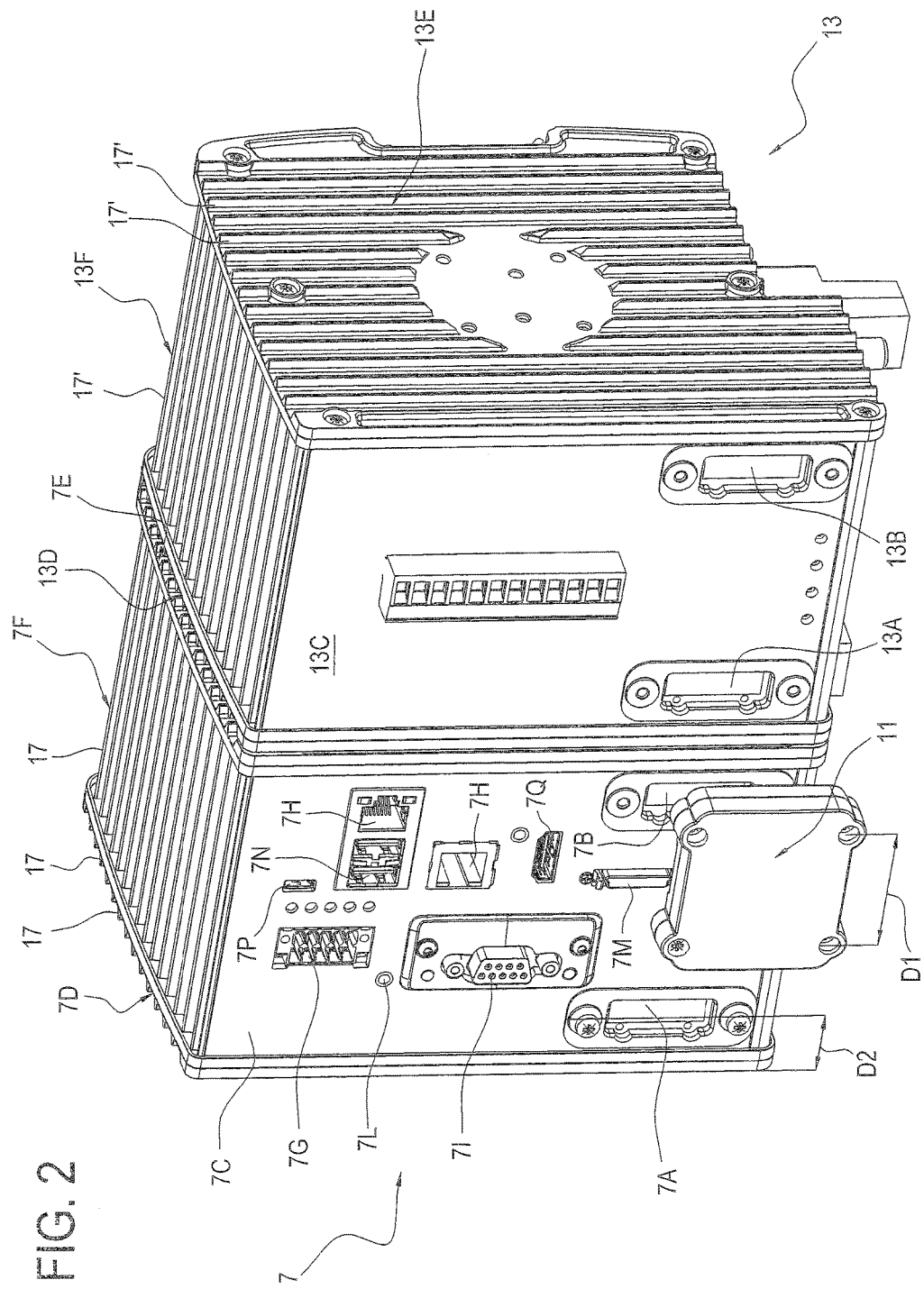

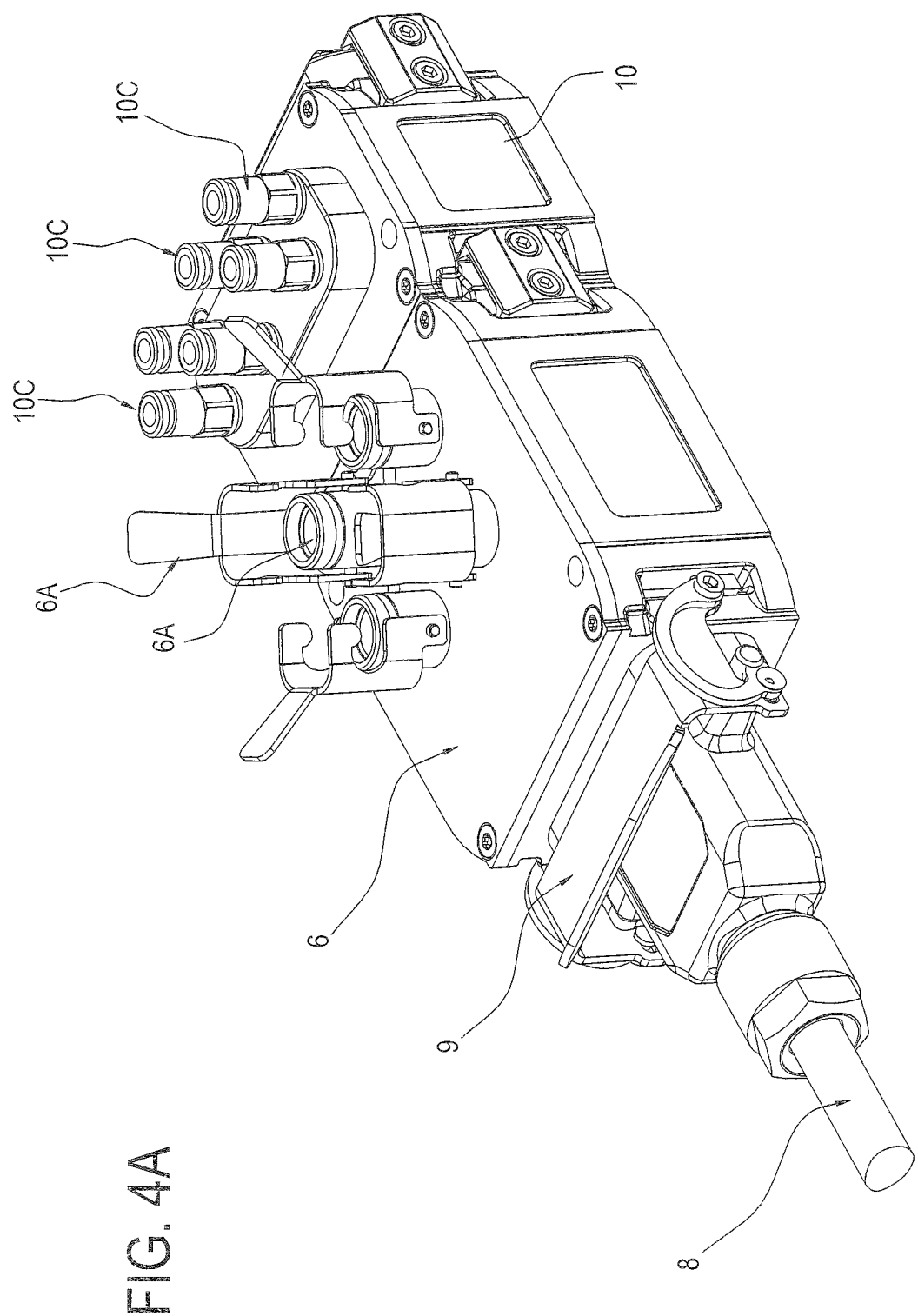

MEASURING AND/OR CHECKING SYSTEM INCLUDING AT LEAST TWO UNITS, AND METHOD TO MANAGE RELATIVE ELECTRICAL CONNECTIONS

The present invention relates to a measuring and/or checking system, with at least two units, each comprising a casing and electronic circuits, and a bridge connector with two multipolar connectors, and a method for managing electrical connections between the two units. The system and method are used advantageously in the checking operations performed by a machine tool.

The environment in which the machine tool works, that is, the area where the mechanical pieces are machined, is typically "polluted", with a high level of dirt (coolants, swarf, . . . ) and noise; however, the control unit (CNC, Computer Numerical Control) is generally located in an electrical panel outside the work area, in a "clean" environment, that is, relatively protected.

The numerical control unit detects in real time measurements of the mechanical piece being processed and machine parameters (for example temperature, imbalance of rotary tools, acoustic emissions) and/or controls actuators located in the machine tool, for example for moving balancing weights or carriages. For that purpose, devices are present in the machine tool, such as sensors and/or actuators, adapted to exchange operational signals with the control unit. For example, the control unit receives data detected by the sensors and/or transmits control signals to the actuators.

In many cases, it is necessary for one or more of these devices to be positioned in the polluted environment.

In this context, a data processing and transmission system is used, operatively interposed between the control unit and the devices.

It should be noted that, in this context, there is an increasing request for flexibility in the data processing and transmission system.

In fact, the dimensions of machines are being reduced to allow the use of spaces to be optimised; there is often the need to place two different machine tools for machining, whereas previously there was a single machine. In addition, there is an increased request for multi-operation machines with mixed technology (for example to perform grinding and turning operations in the same machine).

All this determines the need for flexibility, with the possibility of adapting the data processing and transmission system to the management of different functions.

It should also be noted that the checking performed by the numerical control unit may be basically of two types with respect to the actions performed by the machine tool to be checked: post-process or in-process, depending on whether the checking takes place, respectively, after the action performed by the machine or during the machining with feedback on the machine.

If an in-process checking is performed, it is particularly important and critical to satisfy the need for managing in real time the exchange of information between the control unit and the devices.

Another need is that of synchronising the operational signals exchanged between the data processing and transmission system and the devices; this synchronisation problem may be dealt with according to various approaches, depending on the architecture of the system.

In this regard, it should be noted that the prior art teaches the use of centralized intelligence data processing and transmission systems. In these solutions, the processing hardware of the data processing and transmission system is concentrated in a single apparatus, that is positioned in the electrical cabinet and has a plurality of ports for a parallel connection with the various devices by respective cables. In this approach, all the operational signals are connected to the single apparatus, and the synchronisation occurs inside the apparatuses.

However, the concentrated intelligence data processing and transmission systems have several drawbacks.

A first drawback is due to the fact that the apparatus is bulky and not very flexible, in the sense that it has predetermined dimensions and number of ports which cannot be adapted to the specific application; this means that the apparatus is generally over-sized for a specific application.

A further drawback is due to the installation difficulty, due to the high number of cables to be connected to the apparatus.

Moreover, the distance between the devices and the processing hardware is the cause of not insignificant noise and has a negative effect on the accuracy of the checking.

It should be noted that there are also prior art solutions which use a substantially distributed intelligence architecture for the data processing and transmission system.

However, these solutions do not provide a particularly effective answer to the needs described above, and have further drawbacks and limitations.

A first drawback is due to the fact that they do not allow an effective and simple synchronisation of the data. Another difficulty of these systems is linked to the correlation of the data acquired by the various devices.

Another limitation of such systems is linked to the reliability, in terms of continuity of service and the possibility of preventing faults and malfunctions.

The aim of the present invention is to provide a data processing and transmission system and method for a numeral control unit adapted to control a machine tool which overcome the above-mentioned drawbacks of the prior art.

More specifically, an aim of the present invention is to provide a data processing and transmission system and method which are particularly flexible, which can be adapted simply to the different requirements of use.

Another aim of the present invention is to provide a data processing and transmission system and method which allow the noise to be reduced and the accuracy of the checking to be increased.

Another aim of the invention is to provide a data processing and transmission system and method which simplify installation.

Another aim of the present invention is to provide a data processing and transmission system and method which allow a simple and effective in-process checking to be performed.

Another aim of the invention is to provide a data processing and transmission system and method which are particularly reliable.

Another aim of the present invention is to provide a data processing and transmission system and method which allow a particularly simple and effective data synchronising.

These aims are fully achieved by the data processing and transmission system and method for a numeral control unit adapted to control a machine tool according to the present invention and as characterised in the appended claims.

The data processing and transmission system is adapted to be connected to at least one device present in the machine tool. The device may be a sensor (with relative transducer) or an actuator. More specifically, the data processing and transmission system is adapted to be connected to a plurality of devices such as sensors and/or actuators.

The system comprises at least one input channel adapted to a transit of operational signals from or to devices present in the machine tool. Moreover, the system includes electronic circuits configured to process the operational signals to make available on an output interface control signals for the numerical control unit.

The data processing and transmission system is equipped with a multipolar cable having a first and a second end, each provided with a multipolar connector.

Moreover, the processing and transmission system has a master unit, equipped with a main processor, a memory and at least one socket configured to be coupled to one of the multipolar connectors; moreover, the master unit comprises the output interface toward the control unit.

The processing and transmission system also comprises one or more slave units which are connected to the master unit. Each slave unit has at least one external port, defining one of the input channels of the system for a connection to a device. Moreover, the slave unit has its own memory and a secondary processor. The slave unit is also equipped with a first socket and a second socket, configured to be coupled at least to a first and a second connector of the multipolar connectors. In this way, the slave unit is interconnected with the master unit.

The multipolar cable makes it possible to connect a plurality of slave units to each other and to the master unit, for example in a daisy chain configuration, in such a way that there is a single multipolar cable in the data processing and transmission system connected to the master unit to exchange data with the slave units.

The data processing and transmission system according to the invention makes it possible to create a network including a master unit and one or more slave units, interconnected by means of the multipolar cable.

It is possible to position the slave units in the proximity of the respective devices, reducing the noise and the number of connection cables.

This contributes towards increasing the accuracy of the data processing and transmission system. Moreover, the system is particularly flexible, because it may be adapted to interconnect different configurations of devices simply by adding or removing slave units, without having to over-size the master unit.

In order to simplify the assembling of the system and increase the modularity, for each slave unit the first and/or the second socket may be connected to at least one first or one second socket of a further slave unit either directly or by a piece of the multipolar cable. In that way, it is possible to make a modular structure, having at least a first and a second slave unit, in which one of the first and second slave units has the first socket coupled to one of the connectors of the multipolar cable and the second socket connected, directly or by a piece of cable, to the first socket of the other slave unit.

The multipolar cable defines a plurality of communication channels, which are different from each other according to hierarchical levels depending on the communication speed and complexity (for example, Ethernet, CAN and RS485, in decreasing order of ranking).

Moreover, the slave unit always has its own unique address which may be detected by the master unit through the multipolar cable and acts as a repeater of the signals circulating in the multipolar cable.

The slave units may have different functions (depending on the configuration of one of their printed circuit board), but they have in common the presence of an external port for connection to a device, a memory and a processor adapted to allow a communication through the channel of higher ranking (within the plurality of channels provided by the multipolar cable).

The system can also comprise at least one ancillary unit, provided with a first socket and a second socket configured to connect to at least one of the first and second sockets of at least one slave unit. The ancillary unit is interconnected in the multipolar cable and it propagates the signal.

The ancillary unit, relative to the slave unit, does not have one or more of the above-mentioned features: external port, memory or processor adapted to allow a communication through the channel of higher ranking. The ancillary unit differs from the slave unit since it may have one or more of these properties, but not all. For example, an ancillary unit might be without the memory and/or the external port and/or a processor; it could have a programmable logic or other processing means allowing access to a communication channel of lower ranking (for example, CAN and RS485); or, it could be totally invisible to the master unit (as it does not have an identification code), in which case it can communicate exclusively with the slave unit to which it is connected.

In an embodiment, at least one operation of the ancillary unit is exclusively related to an operation of the slave unit to which it is connected. In other words, in relation to this operation, the ancillary unit performs only functions necessary for the respective slave unit.

According to another aspect of the modularity of the system, the master unit is connected to other units, which allow an extension of the functions of the master unit.

To connect the master unit quickly and easily to another unit, that is to say, a supplementary unit (positioned in the same panel and alongside the master unit), the master unit is equipped with a first and a second socket and the system comprises a dedicated bridge connector. The bridge connector has a first and a second end and comprises a first multipolar connector at the first end and a second multipolar connector at the second end. Both the first and the second connector can be coupled (directly) to one of the first or second sockets of the master unit and to a socket of the supplementary unit.

It should be noted that the bridge connector according to the present invention can be used, advantageously, in any data processing and transmission system for numeral control unit adapted to control a machine tool, which comprises a unit adapted to be connectable modularly to another unit positioned alongside (for example with both the units connected mechanically to a DIN rail in an electrical panel or switchboard).

More generally, the connector bridge according to the present invention may be used in measuring and/or control systems comprising at least one first and one second unit positioned side by side and configured to be connected to each other.

Preferably, in the bridge connector according to the present invention, both the first and the second connector of the bridge connector has retractable (spring type) electrical contacts to facilitate the operations of electrical connection to corresponding sockets of respective units of the system, these sockets comprising, for example, planar electrical contacts, or padtime slot s, adapted to cooperate with such retractable contacts.

Furthermore, with regard to the simplicity of installation and wiring, according to another aspect of the invention, the data processing and transmission system comprises a fast wiring multipolar connector, for assembling in-situ, quickly and simply the connector to an end of the multipolar cable. The fast wiring multipolar connector is equipped with perforating electrical contacts, configured to perforate an insulating sheath which covers the wires contained in the multipolar cable and fixed to the wires.

Moreover, the fast wiring multipolar connector has a first body, equipped with a first group of electrical contacts with a plurality of contact pins which can be coupled to the multipolar socket of the master unit, and a second body, which can be plugged into the first body and equipped with perforating electrical contacts. The contact pins of the first body are retractable (or "spring type") electrical contacts.

It should be noted that the fast wiring multipolar connector according to the present invention can be used, advantageously, in any data processing and transmission system for numeral control unit adapted to control a machine tool, which uses a multipolar cable. For example, it should be noted that the advantage of assembling in a quick and easy manner a connector to one of the two ends of the cable (the one to be connected to the unit positioned in the electrical cabinet) is not limited to distributed intelligence systems.

On the other hand, the other end of the multipolar cable preferably has a pre-assembled multipolar connector, having special sealing capacity with regard to moisture and dust.

This makes it possible to use the pre-assembled multipolar connector in the polluted environment and use the free end of the multipolar cable to conveniently perform passages in machine cable carrying ducts, and then, after suitably arranging the multipolar cable, assembling the fast wiring multipolar connector to the free end of the multipolar cable and connecting it to the master unit in the clean environment.

More generally speaking, the fast wiring multipolar connector according to the present invention may be advantageously used in measurement and/or checking systems comprising at least one first and one second unit with sockets configured to be coupled to multipolar connectors of a cable, to make the electrical connection.

According to another aspect, the multipolar cable also has the function of electrically powering the slave units.

This reduces further the installation and maintenance time, and simplifies installation. Moreover, the presence of a single multipolar cable simplifies the sizing of the network defined by the system. According to another aspect, the master unit has a clock and each slave unit has its own clock. The main processor is programmed to generate a synchronisation signal and to transmit the synchronisation signal through the multipolar cable, in order to synchronise all the clocks of the slave units with the clock of the master unit.

In a preferred embodiment, the synchronization of the clocks is implemented according to the method provided by the IEEE 1588 Precision Time Protocol (PTP). The master unit sends, through for example the Ethernet communication channel, a synchronization signal that is received almost simultaneously by all the slave units. More specifically, the synchronization signal sent by the master unit is propagated through the slave units, starting from the nearest one in the series, and is received by every slave unit that synchronizes its own clocks independently from the other slave units. Every slave unit receives the synchronization signal with a minimal delay with respect to the upstream slave unit due to the signal propagation time. The synchronization signal is transmitted as it is by every slave unit, that is to say, every slave unit receives the synchronization signal as it is generated by the master unit, the signal is not processed by the slave unit before reaching the other one. This allows the data processing and transmission system to correlate and synchronise the data in a particularly simple and effective manner.

More specifically, two or more slave units comprise an electronic circuit for generating an alternating electric excitation signal (for an inductive transducer of a sensor to which the slave unit is connected). All the alternating electric excitation signals generated are synchronised temporally with each other. This prevents noise in the system due to a beat phenomenon generated by the simultaneous presence of unsynchronised sinusoidal signals. This noise is typically low frequency and is particularly harmful to the system.

According to another aspect, relative to the mode of transferring data from the slave units to the master unit, the main processor is programmed to divide a data transmission time interval into a plurality of time slot sand to uniquely assign to each slave unit a corresponding time-slot of the plurality of time slots. For each slave unit, the secondary processor can be set for transmitting data through the multipolar cable only within the respective time slot.

This makes it possible to transmit data from the slave units to the master unit with maximum latency time, contributing towards a particularly reliable in-process checking, which requires responses within a quick and clear time frame.

Preferably, the main processor is programmed to assign to each slave unit a unique identification code and it is programmed to perform a continuous data collection cycle. At each time slot of the data transmission time interval the main processor receives and stores the data transmitted by the corresponding slave unit and associates the data with the slave unit which the data comes from.

It should be noted that each slave unit is configured to receive at least one operational signal through the external port, and to acquire and store corresponding data.

According to another aspect of the data processing and transmission system according to the present invention, each slave unit is configured to assign corresponding acquisition instants to the data acquired, on the basis of its own clock.

This favours the capacity of the system to keep under control a large number of process parameters, in order to improve the quality standards and guarantee greater reliability of operation of the machine.

It should be noted that, in the data processing and transmission system according to the present invention, according to another aspect, the master unit comprises a diagnostic block.

The diagnostic block has electronic circuits and is configured for detecting or collecting, at least for the master unit, at least one power supply parameter. Alternatively or in addition, the diagnostic block is configured for collecting, at least for the master unit and/or for one or more of the slave units, an internal temperature.

Preferably, the diagnostic block is configured for collecting the internal temperatures of both the master unit and all the slave (and ancillary) units.

In an embodiment, the diagnostic block is configured for collecting at least one power supply parameter also for the slave units, taken individually, or for the entire system, that is, all the slave units and the master unit.

For example, the diagnostic block of the master unit is configured for detecting or collecting one or more of the following parameters: supply voltage, electrical current draw, power draw.

Preferably, the diagnostic block is connected to an electrical power supply of the master unit: to prevent that the detection of the at least one power supply parameter causes an electromagnetic pollution in the electronic components of the system the diagnostic block is coupled to the main processor through an opto-isolated interface.

It should be noted that the multipolar cable preferably contains one or more wires (at least one supply and one return) which define an electrical power supply for the system, in particular for the slave and ancillary units.

Preferably, the slave (and ancillary) units and preferably also the master unit are connected in parallel to the power supply wires.

Preferably, the slave (and ancillary) units and preferably also the master unit, each have a power supply circuit (for example a DC/DC converter) defining a galvanic insulation, interposed between the relative electronic components (to be powered) and the power supply wires. The purpose of this is to guarantee that the electronic components of the slave (and ancillary) units and the master unit operate in a "clean" electric room.

Preferably, the diagnostic block has its own connection with the power supply wires, whilst the interface with the main processor is insulated galvanically, for example by an optical connection (coupling). This allows the diagnostic block to read voltage and current or other quantities representing an electricity consumption by the system, without causing alterations in the electrical power supply of the electronic components of the master unit. An optical coupling with relative voltage or current reading may be provided in one or more of the ancillary units.

This makes the data processing and transmission system particularly reliable, allowing the energy consumption to be monitored and identifying any faults, with the possibility of generating warning or fault signals and preventing these situations.

This and other features of the invention will become more apparent from the following description of a preferred embodiment, illustrated by way of non-limiting example in the accompanying drawings, in which:

FIG. 1 schematically shows a front view of a numerical control machine tool;

FIG. 1A schematically shows the inside of the machine tool of FIG. 1, containing a system according to the present invention;

FIG. 2 shows a perspective view of the master unit belonging to the system of FIG. 1, which can be connected to a supplementary unit by means of a bridge connector according to the present invention;

FIG. 4A shows a perspective view of a group comprising the slave unit of FIG. 3 connected to an ancillary unit, according to the present invention;

FIG. 6A shows an enlarged cross sectional detail of the fast wiring multipolar connector of FIG. 6;

Figure 1:
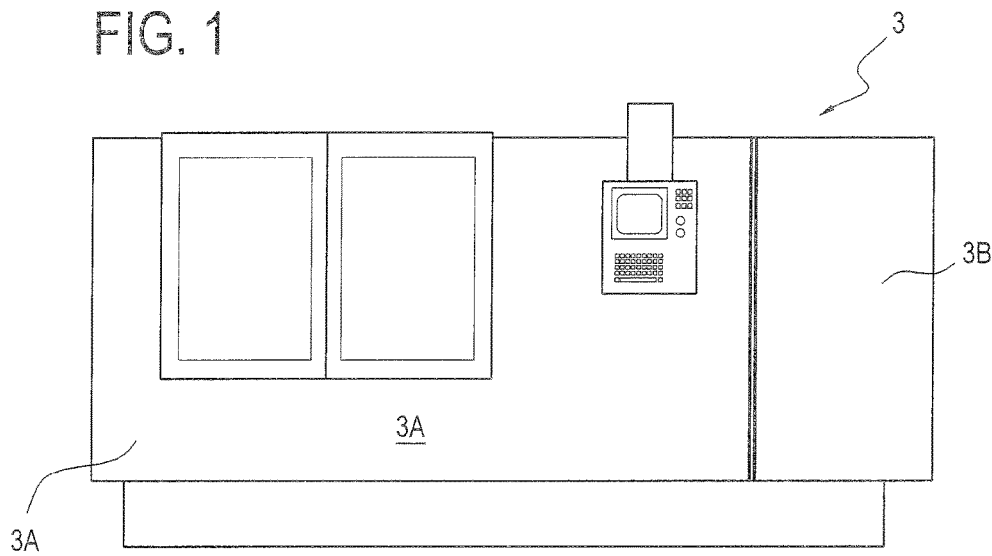
FIG. 1B shows a diagram representing the system according to the present invention.
Figure 1A:
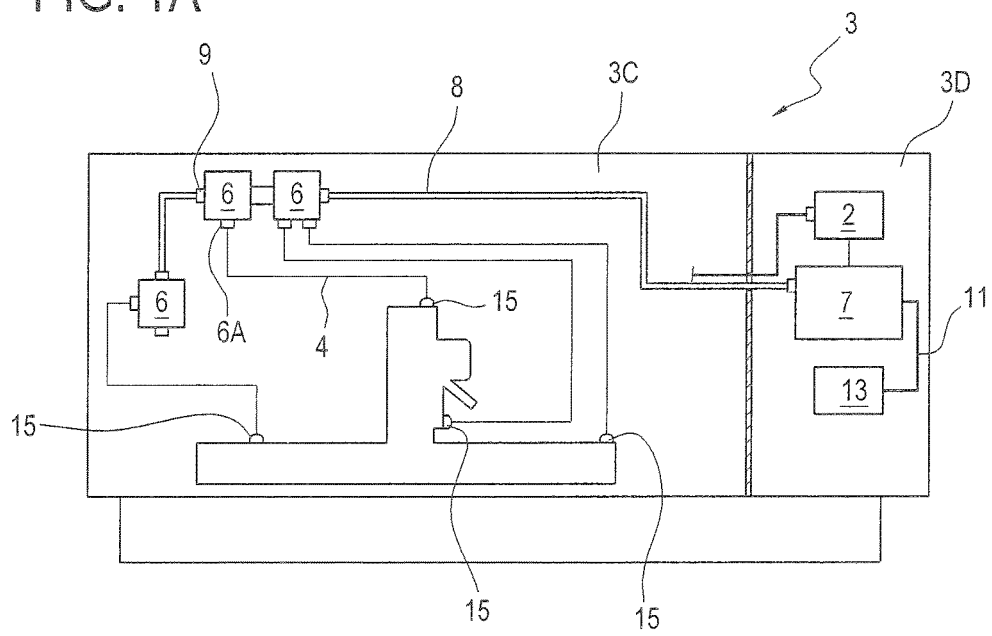
Figure 1B:
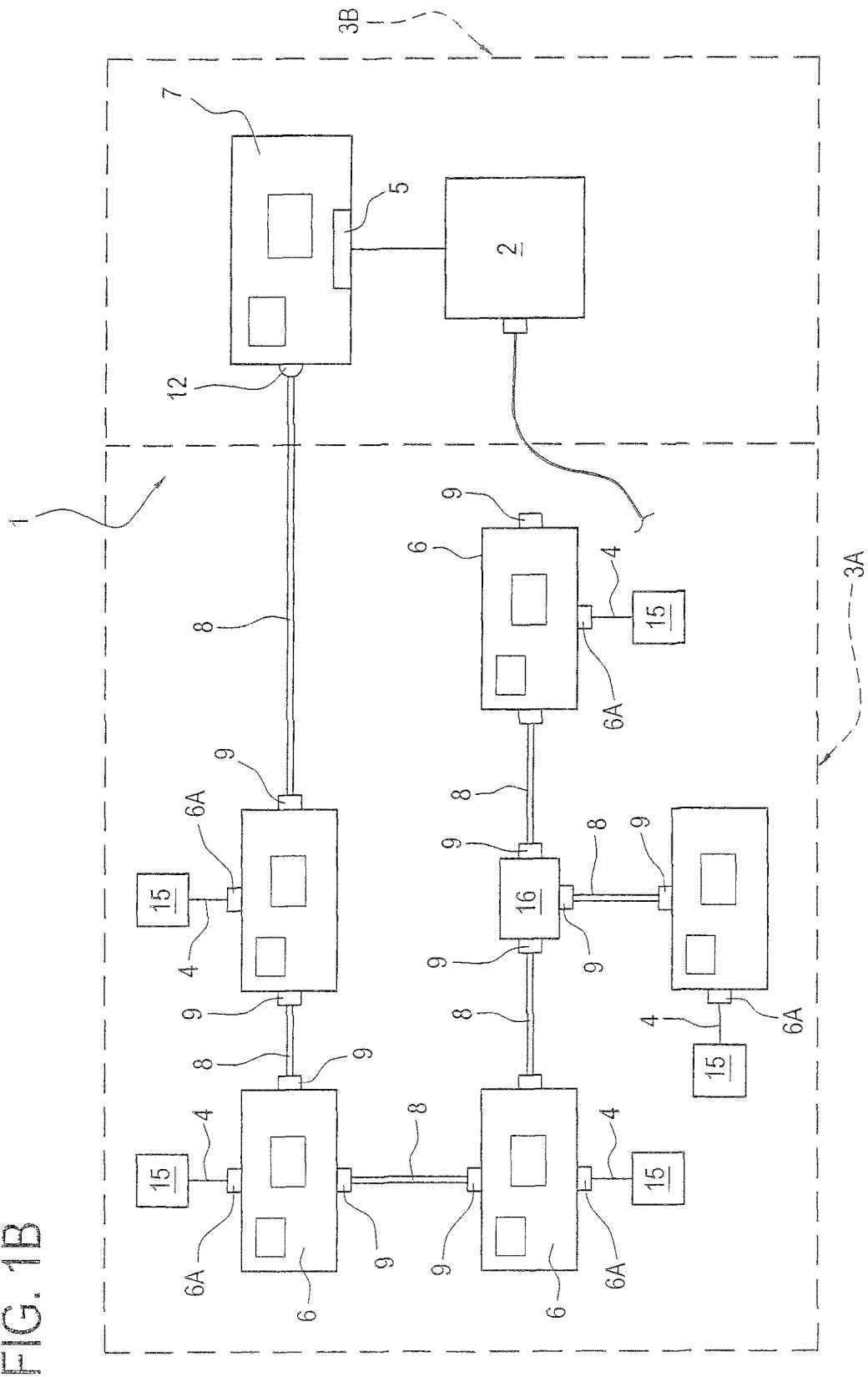
Figure 3:
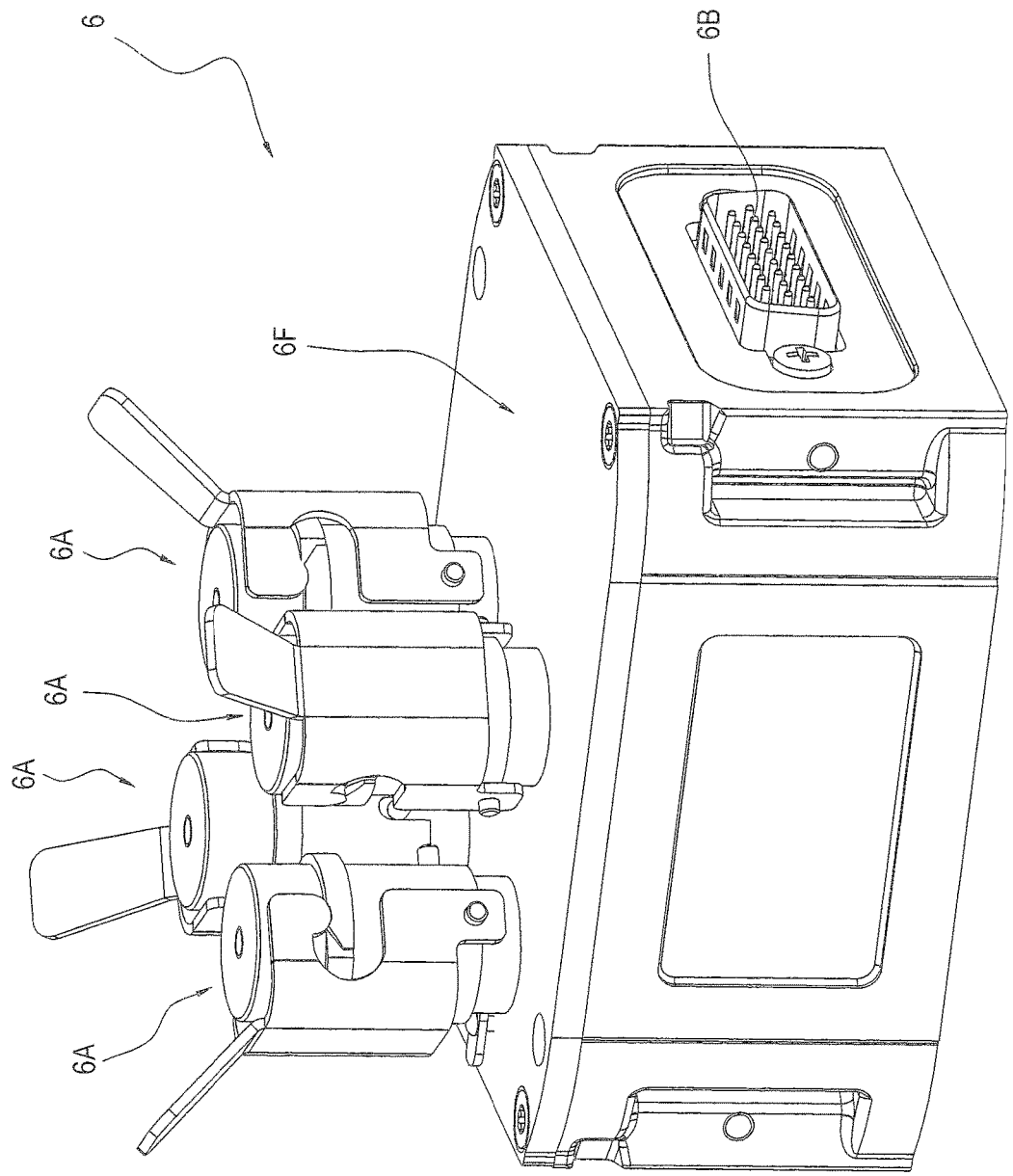
FIG. 3 shows a perspective view of a slave unit belonging to the system of FIG. 1.
Figure 4B:
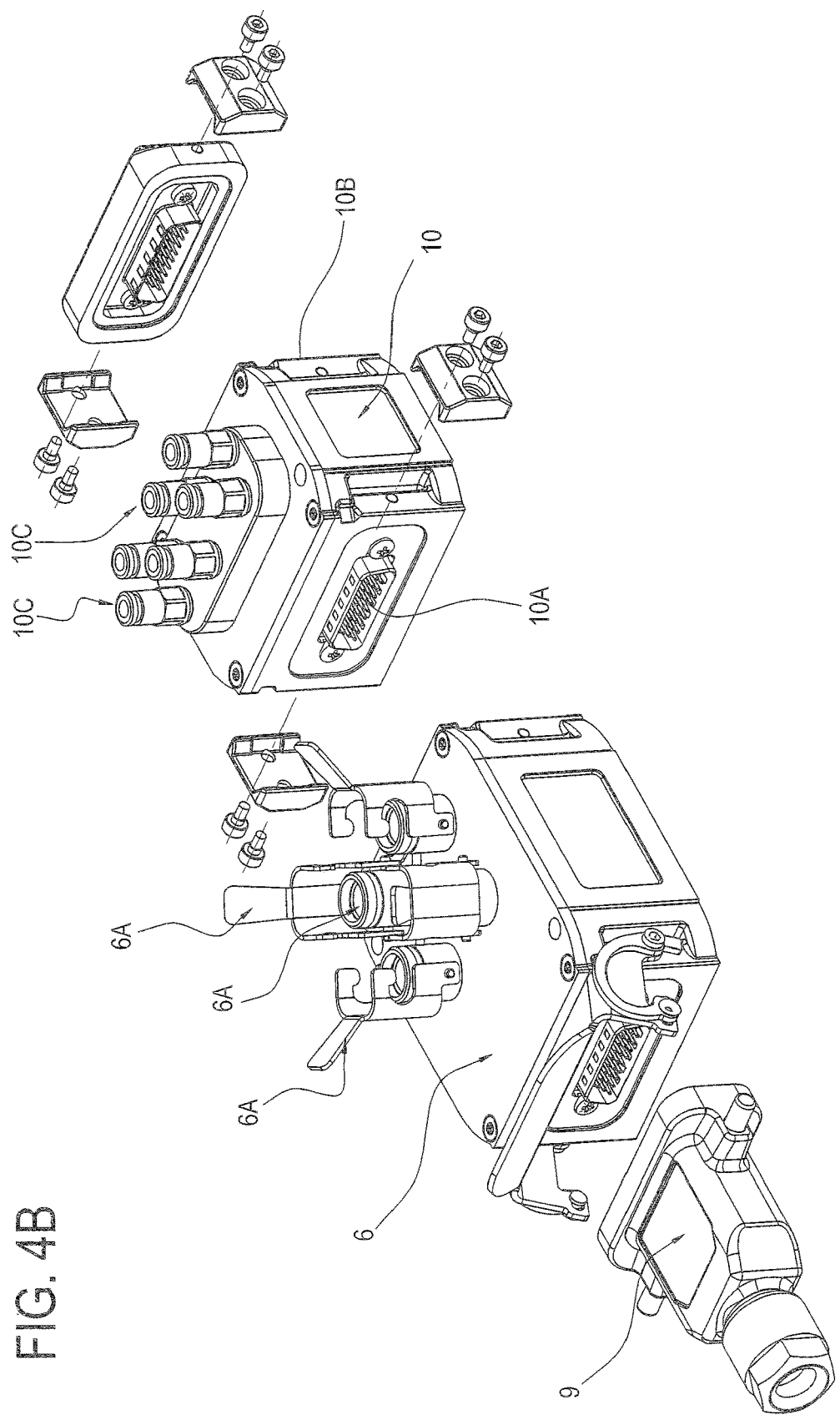
FIG. 4B shows an exploded view of the group of FIG. 4A.
Figure 5:
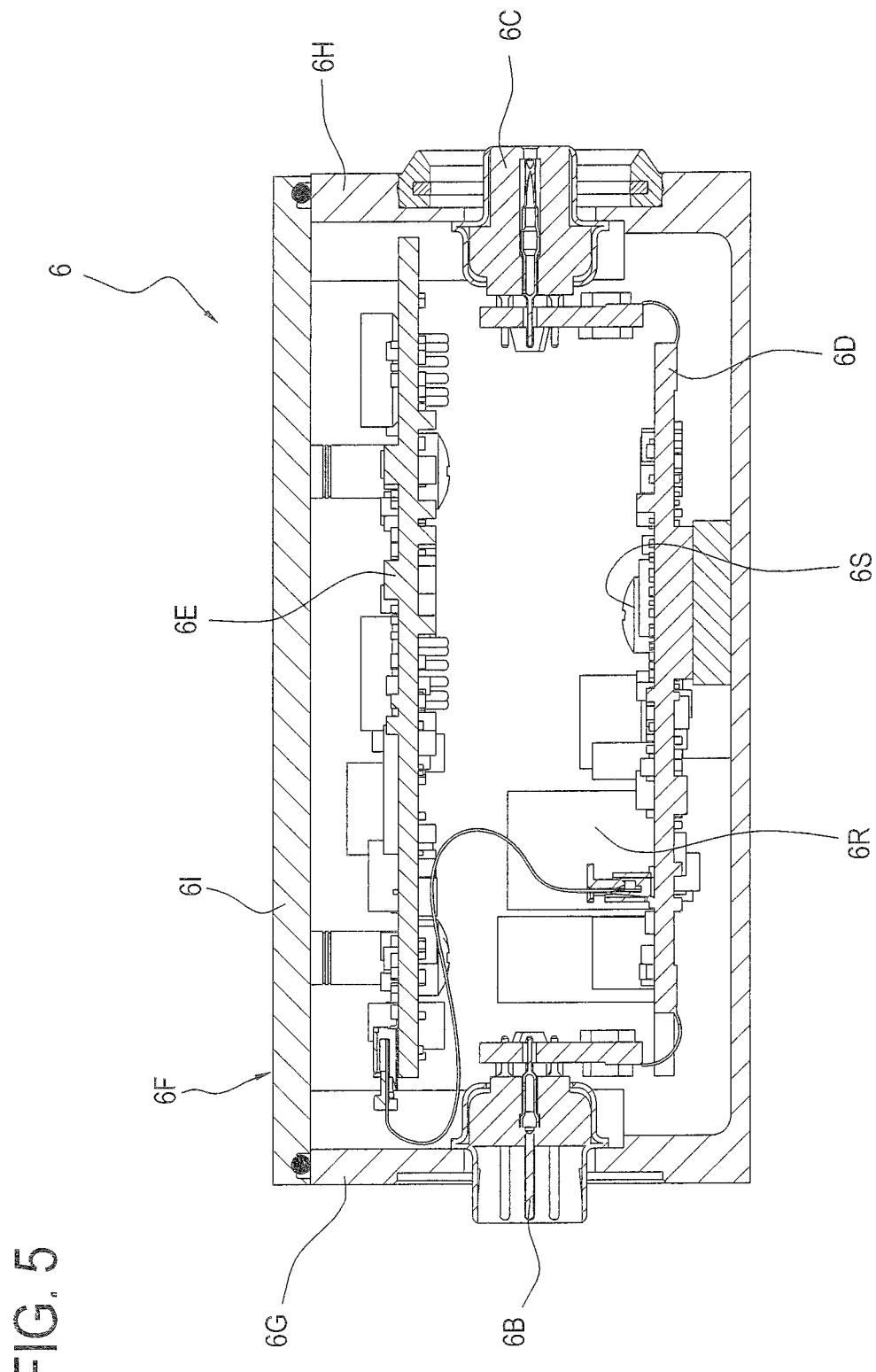
FIG. 5 shows a side view of a cross section of the slave unit of FIG. 3, with certain details omitted.

With reference to the attached drawings, the reference number 1 indicates a data processing and transmission system for a numerical control unit 2 adapted to control a machine tool 3.

The machine tool 3 has a work chamber 3A, in which at least one tool is positioned. The work chamber 3A defines its own inner space 3C, that is to say a work space. Typically, the work space 3C constitutes a polluted (dirty) environment.

The machine tool 3 also comprises, typically, an electrical panel or switchboard 3B, in which the numerical control unit 2 is positioned. The electrical panel 3B defines its own inner space 3D. The inner space 3D of the electrical panel 3B constitutes a relatively clean environment; indeed, it is separated, for example by a wall, from the work space 3C of the machine tool 3.

The system 1 comprises at least one input channel 4 adapted to a transit of operational signals from devices 15 present in the machine tool 3 or to devices 15 present in the machine tool 3. The system 1 also comprises electronic circuits configured to process the operational signals to make available on an output interface 5 control signals for the numerical control unit 2.

Typically, the devices 15 are positioned in the work space 3C of the machine tool 3 and can be for example sensors or actuators.

The system 1 according to the invention comprises one or more slave units 6, that is, at least one slave unit 6, provided with at least one external port 6A, defining the input channel 4.

The system 1 comprises a master unit 7 having the output interface 5.

Preferably, the master unit 7 is located in the space 3D of the electrical panel, and is therefore positioned in the non-polluted environment, close to the numeral control unit 2.

On the other hand, preferably, at least one of the slave units 6 is located in the work space 3C, close to a respective device 15 (thus minimising also the length of the cable, or the cables connecting the slave unit 6 to the respective device 15). Generally speaking, slave units 6 are preferably located in the work space 3C; however, one or more slave units 6 may be positioned in the space 3D of the electrical panel, depending on the relative function.

The master unit 7 comprises a memory (that is, main memory) 7R and a main processor 7S. Each slave unit 6 comprises a memory (that is, secondary memory) 6R and a secondary processor 6S.

Preferably, the slave unit 6 is configured for acquiring at least one operational signal through the external port 6A and storing it in the memory 6R.

The system 1 comprises a multipolar cable 8 for connecting at least one of the slave units 6 to the master unit 7. Preferably, the multipolar cable 8 is inserted in an opening in the partition wall which separates the work space 3C from the space 3D of the electrical panel.

The connection between the slave units 6 may be carried out by pieces of multipolar cable 8 or by direct connection of the sockets 6B and 6C.

In an embodiment, the multipolar cable 8 has a first and a second end, each end provided with a multipolar connector 9. The master unit 7 comprises at least one first socket 7A configured to be coupled to one of the multipolar connectors 9. Each slave units 6 is provided with a first socket 6B and a second socket 6C, configured to be coupled at least to one first or one second connector of the multipolar connectors. The multipolar cable 8 connects the at least one slave unit 6 to the master unit 7.

In an embodiment, the system 1 comprises a plurality of slave units 6 connected in series to each other and one of them is connected to the master unit 7 by means of a piece of the multipolar cable 8. The slave units are connected to each other directly or by the multipolar cable 8.

In an embodiment, the system 1 comprises at least two slave units 6, that is to say, it comprises a plurality of slave units 6.

In an embodiment, the system 1 comprises a multipolar connector 16. The multiple connector 16 has a first, a second and a third multipolar connector 9, each of which is configured to couple to one of the multipolar connectors of the multipolar cable 8 and connect to the first or the second socket of the slave units 6. It should be noted that in this way it is possible to make branches, for example connecting the first multipolar connector to a first slave unit 6, the second multipolar connector to a second slave unit 6 and the third multipolar connector, either directly or indirectly, to the multipolar cable 8 which is connected to the master unit 7.

The multiple connector 16 has its own processor, programmed to detect the data entering in one of the three multipolar connectors and to handle a flow of data coming from the remaining two multipolar connectors.

The present invention also relates to a fast wiring multipolar connector 12. The purpose of the fast wiring multipolar connector 12 is to allow a multipolar cable to be connected, that is, provided with a connector at one end, in a fast and simple manner, on-site, without the need for specific or complicated tools (for example, a screwdriver and a pair of scissors are sufficient).

In an embodiment, the system 1 comprises the fast wiring multipolar connector 12, which can be coupled to an end of the multipolar cable 8.

The fast wiring multipolar connector 12 of the illustrated example is equipped with a plurality of perforating electrical contacts 12P, configured to perforate an insulating sheath which covers wires 8A housed in the multipolar cable 8 and fasten and electrically connect the wires and the perforating electrical contacts to each other. According to an embodiment, the perforating electrical contacts 12P are housed in a plurality of seats 12S of a frame which also house the sheathed wires 8A of the multipolar cable 8. A plurality of movable elements 12D, coupled to the frame, are adapted for cooperating, in the seats, with the wires housed in the multipolar cable to fasten and the electrically connecting the wires and the perforating electrical contacts to each other.

In an embodiment, the movable elements 12D are covering elements, each of which is movable between a first position, wherein it closes the respective seat and presses on the wire 8A positioned in this seat, and an open position, which allows the insertion and extraction of the wire 8A in and from the seat.

The perforating electrical contacts 12P may have an elongate shape and comprise one or more conductive teeth (that is, plates or other cutting elements made of a conductive material) at one end, whilst the free end opposite may have the form of gripper, as shown in FIG. 6A. When the wire 8A is positioned in the seat 12S and the covering element 12D is closed, the conductive teeth of the respective perforating electrical contact perforate the sheath thus connecting electrically the wire and the perforating electrical contact.

This is the preferred embodiment, but the perforating contacts may be positioned, for example, in the covering element 12D and be movable with it.

In a preferred embodiment, the fast wiring multipolar connector 12 has a first body 12A and a second body 12B.

In an embodiment, the first body 12A has a support with two opposite faces which may comprise at least one printed circuit board, or two or more printed circuit board rigidly and electrically connected to each other. Front electrical contacts of a first group of electrical contacts, or contact pins 12C, are fixed to one of the faces of the support and can be coupled to corresponding electrical contacts (for example pads, that is to say planar electrical contacts, or holes) of a multipolar socket (for example a socket 7A of the master unit 7 or a socket 6B, 6C of a slave unit 6).

In an embodiment, the contact pins 12C are retractable, or "spring type", that is to say, they are movable elastically independently of each other.

Electrical contacts of a second group of electrical contacts are fixed to the other face of the support of the first body 12A. The second body 12B can be plugged into the first body 12A. In an embodiment, the electrical contacts of the second group, electrically connected to the contact pins, are housed in hollow coupling elements 12E fixed to the respective face of the support.

The second body 12B has a first and a second end, the latter connected to the cable 8.

At the first end of the second body 12B there are the ends in the form of a gripper of the perforating electrical contacts 12P which, in an embodiment, are housed in protruding coupling elements 12F fixed to the frame. More specifically, the protruding coupling elements 12F can be snap coupled to the hollow coupling elements 12E to plug the second body into the first one and electrically connecting the perforating electrical contacts and the electrical contacts of the first group.

Figure 6:
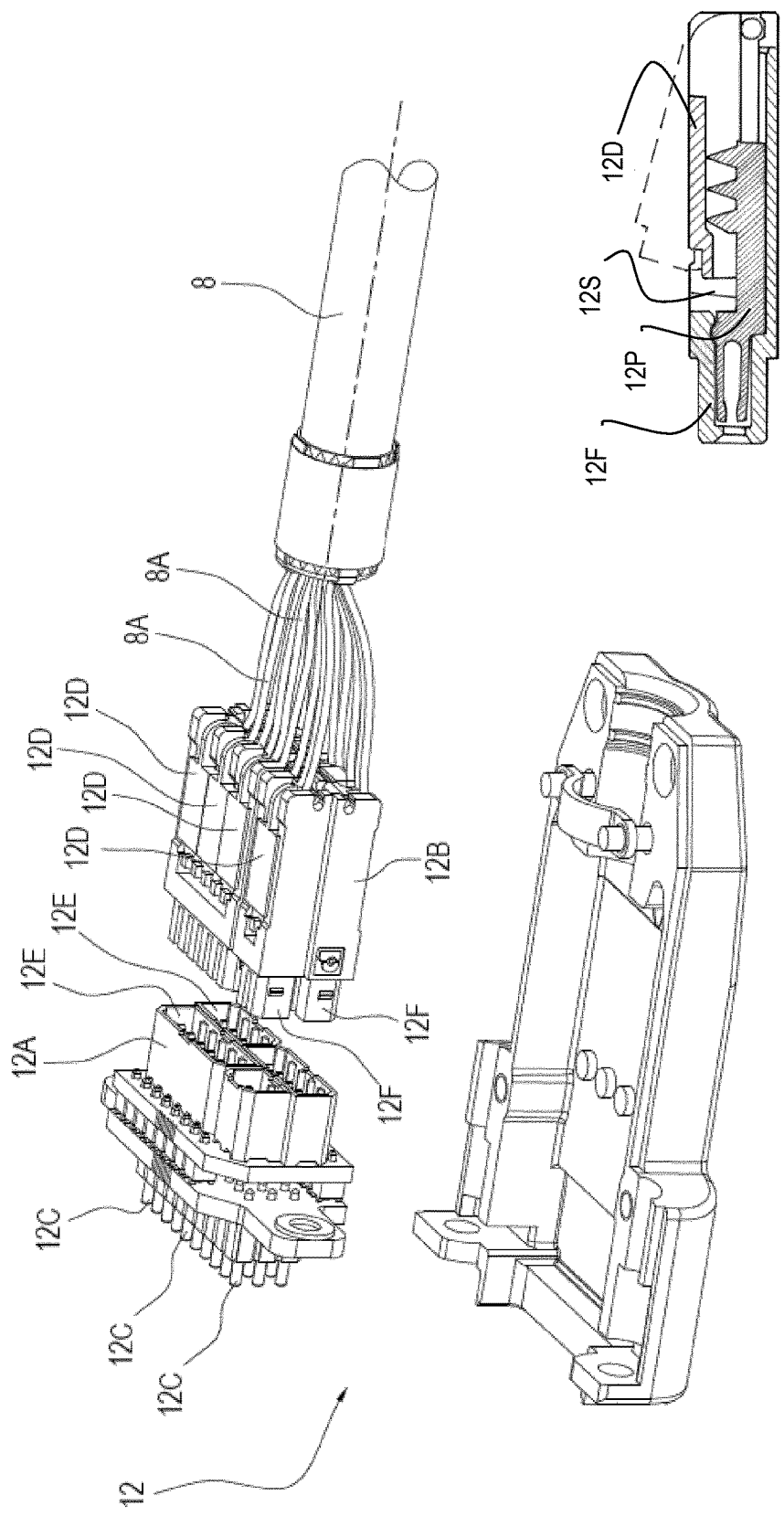
FIG. 6 shows an exploded perspective view of a fast wiring multipolar connector belonging to the system of FIG. 1, with certain details omitted.
Figure 7:
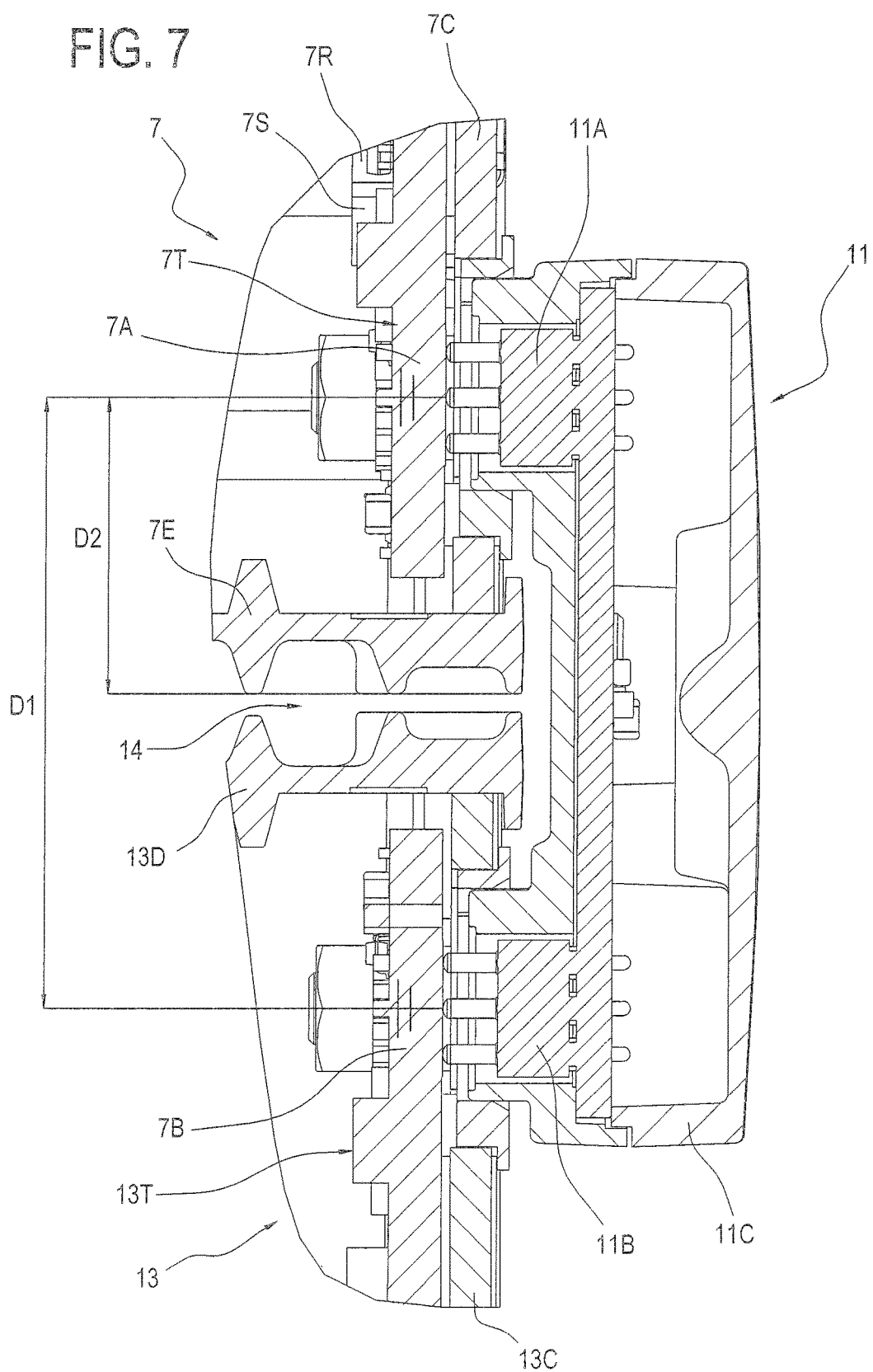
FIG. 7 shows a cross section of a bridge connector, which connects a master unit and a supplementary unit according to the present invention.

FIG. 6 shows only one half of a protective casing, of known type, for the fast wiring connector.

In an embodiment, the master unit 7 has a clock and each slave unit 6 has its own clock. The main processor 7S of the master unit 7 is programmed to generate a synchronisation signal and to transmit the synchronisation signal through the multipolar cable 8, synchronising the clocks of the slave units 6 with the clock of the master unit 7. Preferably, each slave unit 6 has its own unique address which may be detected by the master unit 7 through the multipolar cable 8.

With regard to the slave unit 6 (or slave units 6), the following should be considered.

In an embodiment, the slave unit 6 comprises a first electronic bo printed circuit board and 6D connected to the first socket 6B and to the second socket 6C and configured for managing data transmission through the multipolar cable 8. The first printed circuit board 6D comprises a processor (for example a CPU).

The slave unit 6 comprises a second printed circuit board 6E connected to the first printed circuit board 6D and to the external port 6A and adapted for managing the transit of operational signals through the corresponding input channel 4.

In an embodiment, the second printed circuit board 6E comprises a further, relative processor; alternatively, the second printed circuit board 6E my use the processor of the first printed circuit board 6D (and is free of its ownprocessor).

Preferably, the first printed circuit board 6D is the same for all the slave units 6, both in terms of software and hardware.

On the other hand, the second electronic board 6E preferably has a configuration (hardware and/or software) which depends on the function performed by the slave unit in which it is mounted.

This simplifies the production of the system and reduces the storage requirements.

In an embodiment, the slave unit 6 comprises a protective shell 6F, containing the memory 6R, the secondary processor 6S, the first printed circuit board 6D and the second printed circuit board 6E. Preferably the protective shell 6F defines a seal equal to or greater than IP65 rating.

In a preferred embodiment, the protective shell 6F comprises a first side wall 6G on which is positioned the first socket 6B and a second side wall 6H on which is positioned the second socket 6C. The protective shell 6F also comprises an upper wall 6I on which is positioned at least one external port 6A.

In an embodiment, the external port 6A of the slave unit 6 is enabled both for transmitting and receiving operational signals. The slave unit 6 is connectable, by means of the external port 6A, to one or more sensors 15 present in the work space 3C of the machine tool 3. The term "sensor" identifies for example a measurement head with a position transducer, a vibrations sensor or an acoustic sensor. These sensors are adapted to generate signals representing parameters relative to the machining performed by the machine tool 3, detected during the operation of the machine 3. The slave unit 6 is connectable to the sensors 15 for acquiring these signals. The slave unit 6 is also connectable to actuators adapted to receive control signals transmitted by the slave unit 6.

In a system 1 with two or more slave units 6 connected to sensors with inductive measurement transducers, the slave units 6 comprise an electronic circuit for generating an alternating electric excitation signal, and all the alternating electric excitation signals are synchronised in time with each other. Each of the two or more slave units 6 is programmed to transmit as output the alternating electric excitation signal through the respective external port 6A, in order to energise the corresponding measuring transducer made with a variable inductive coupling.

In an embodiment, each of the two or more slave units 6 comprises a generator of a first and a second digital PWM (pulse width modulation) signal. Each of these two or more slave units 6 comprises processing circuits adapted to receive the first and second digital PWM signals and to process them to generate the alternating electric excitation signal consisting of a sinusoid.

In an embodiment, the generation of the sinusoid for exciting the transducer is achieved with a digital technique, according to which two PWM digital signals are generated. The PWM signals are summed and/or subtracted, or in any case combined according to a mathematical function; the signal resulting from that sum or subtraction or combination is filtered to generate the sinusoid.

This technique make it possible to obtain a sinusoid with a very low level of harmonic distortion, thanks to the possibility of conveniently modulating the duration of the two PWM digital signals. It should also be noted that the use of a digital device facilitates the synchronisation of the generation of the sinusoid with signals coming from the outside.

In an embodiment, for each of the two or more slave units 6, the electronic circuits for generating the alternating electric excitation signal are configured to correct the alternating electric excitation signal in phase, preferably at predetermined regular time intervals, in order to synchronise it in phase with another alternating electric excitation signal generated by another slave unit 6.

In an embodiment, each slave unit 6 has a timer to generate a reference signal (for example a square wave), which is used to generate the sinusoid (for example using one or more PWM signals).

Thanks to the fact that each slave unit 6 has a clock (connected to the timer) and all the clocks are synchronised, the slave unit 6 is programmed to vary over time the frequency of the reference signal, to phase all the reference signals of all the slave units 6 (all those designed to generate reference signals), since they are synchronised with a reference signal generated by the master unit or with the reference signal generated by one of the slave units (selected in an arbitrary way as a reference for the others). As a result, the sinusoids generated by all the slave units are synchronised with each other.

In an embodiment, each slave unit 6 is configured for acquiring, through the external port 6A, at least one operational signal. The operational signal may be a digital signal comprising data, or an analogue signal representing the trend of quantity and therefore having an information content.

Preferably, each slave unit 6 is configured to store the operational signal and is programmed to assign to the data acquired through the external port 6A corresponding acquisition instants, on the basis of a relative clock.

The data acquired by the devices 15 are stored in the slave units 6 and transmitted according to a communication protocol to the master unit 7.

A corresponding timing information detected by the high precision clock present in each slave unit is associated to the data acquired. The timing information is sent to the master unit 7 associated with the data acquired.

This allows (in combination with the fact that the clocks of the slave units 6 are synchronised with that of the master unit) the master unit 7 to collect data coming from different slave units 6 and to correlate them in time with each other, either in real time (this is particularly useful for the in-process checking) or a posteriori.

In an embodiment, each slave unit on 6 is programmed for storing, for a predetermined interval of time, the data acquired through the external port 6A. Preferably, each slave unit 6 is programmed for storing the data in a data packet and is programmed to transmit at least the data packet to the master unit 7, through the multipolar cable 8.

In an embodiment, the slave units 6 of the plurality of slave units 6 can be connected together to form a modular structure.

Preferably, the first socket 6 of the slave unit 6B is male and the second socket 6C is female. For example, the first socket 6B of a first slave unit can be coupled to a second socket 6C of a second slave unit; the second socket 6C of a first slave unit can be coupled to a first socket 6B of a second slave unit. In an embodiment, the first slave unit has the first socket 6B coupled to one of the multipolar connectors 9 of the multipolar cable 8 and the second socket 6C connected, for example directly coupled, to the first socket 6B of the second slave unit; the second socket 6C of the second slave unit is coupled to one of the multipolar connectors 9 of the multipolar cable 8.

If the slave units 6 are not connected with each other by coupling the respective sockets 6B, 6C, they may be connected using the multipolar cable 8. For example, the multipolar cable 8 comprises two or more pieces, each having a first and a second end equipped with a multipolar connector 9, to connect to each other the slave units 6 and/or to connect at least one slave unit 6 with the master unit 7.

It should be noted that the term "slave unit" identifies a unit which interfaces a device, such as a sensor, with a network comprising at least one slave unit and the master unit 7 connected by the multipolar cable 8. Preferably, the slave unit is able to perform basic processing such as filtering and/or conditioning a signal or even more complex operations. For example, the slave unit 6 is able to autonomously process control signals for an actuator connected to it, even as a function of a signal detected by a sensor connected to the slave unit.

In an embodiment, the system 1 may comprise at least one ancillary unit 10, provided with a first socket 10A and a second socket 10B. The first socket 10A and the second socket 10B of the ancillary unit 10 are configured to connect at least to one of the first socket 6B and second socket 6C of the slave unit 6.

The ancillary unit 10 differs from the slave unit 6 due to the fact that it has a reduced processing and/or communication capacity.

It should be noted that the slave unit 6 has, as well as a memory, a processor which allows to perform complex processing and exchange data through a complex and fast communication channel (for example Ethernet).

Unlike the slave unit 6, the ancillary unit 10 does not have a processor, that is, a data processing system; alternatively, the ancillary unit 10 can have its own processing means, consisting for example of a programmable logic.

In predetermined cases, the ancillary unit 10 is equipped with its own memory.

The ancillary unit 10 may not have access to any communication channel defined by the multipolar cable 8, or may be configured for exchanging data through a communication channel defined by the multipolar cable 8, preferably of lower ranking than the communication channel used by the slave units (for example, a CAN or RS485 communication channel).

In an embodiment, at least one operation of the ancillary unit 10 is controlled by an operation of the slave unit to which it is connected.

For example, if the slave unit 6 is connected to a device comprising a measurement head with a measuring feeler, a relative ancillary unit 10 may comprise a solenoid valve and a connecting element 10C for a compressed air circuit, to retract the measuring feeler in a per se known step of a checking cycle.

In another example, it should be noted that the multiple multipolar connector 16, which does not have an external port for connection to a device 15, itself defines an ancillary unit 10.

In another example, the ancillary unit 10 might consist of a voltage amplifier, connectable to an external electrical power source, to provide an output supply voltage higher than the input voltage.

This type of ancillary unit 10 does not have a memory and processor.

With regard to the master unit 7, the following should be considered.

In an embodiment, the master unit 7 comprises a first socket 7A and a second socket 7B. For example, each of the sockets may comprise planar electrical contacts or "pads" which can be coupled to respective retractable electrical contacts present in multipolar connectors.

In an embodiment, the master unit 7 has the shape generically of a parallelepiped with a front wall 7C, a back wall 7F and a bottom wall 7T. Preferably, the first socket 7A and the second socket 7B are positioned in the front wall 7C of the master unit 7. In an embodiment, the master unit 7 comprises elastic snap-on locking elements (not shown, per se known and located on the back wall 7F) which are configured to fix the master unit 7 to a supporting or mounting bar of the electrical panel, for example a DIN rail.

Preferably, the first socket 7A and the second socket 7B of the master unit 7 are positioned on opposite sides of the front wall 7C, respectively close to a first outer side wall 7D and a second outer side wall 7E of the master unit 7. Preferably, the first socket 7A and the second socket 7B of the master unit 7 are positioned at the same height, that is to say, at a same distance from the bottom wall 7T of the master unit 7.

According to a preferred embodiment, the master unit 7 has flat side walls 7D, 7E and a plurality of fins 17 which protrude from the side walls 7D, 7E. The function of the fins 17 is to favour heat exchange and thus the cooling of the master unit 7. Preferably, the fins 17 are parallel to each other and perpendicular to the bottom wall 7T of the master unit 7. Preferably, when the master unit 7 is fastened to the support (for example to the DIN rail), the fins are oriented vertically.

More specifically, the fins 17 are arranged perpendicularly to the locking elements of the master unit 7 to a support. For example, the fins are oriented perpendicularly to the locking elements on the back wall 7F for connection to the DIN rail.

Moreover, the top surface of the master unit 7 is also provided with fins.

Preferably, the master unit 7 also comprises a cooling fan (not illustrated) positioned in a space inside the master unit 7. The purpose of the cooling fan is to make uniform the temperature inside the master unit 7 and it cooperates with the fins 17 to cool the electronic components housed in the master unit 7.

In a preferred embodiment the master unit 7 comprises a power supply socket 7G, a network socket 7H, a field bus socket 7I adapted to couple to a further multipolar signal connector, one or more alarm warning lights 7L, a peripheral port 7M for a connection to a display which is remote or can be made remote.

The master unit can also comprise one or more USB 7N and/or USB On-The-Go 7P ports (also known as USB OTG) and/or a HDMI 7Q port.

In a preferred embodiment, the electricity supply socket 7G, the network socket 7H, the field bus socket 7I, the alarm warning lights 7L, the peripheral port 7M, the USB ports 7N, 7P and the HDMI port 7Q are positioned on the front wall 7C of the master unit 7.

In an embodiment, the main processor 7S is programmed to divide a data transmission time interval into a plurality of time slots and to uniquely assign to each slave unit 6 a corresponding time slot of the plurality of time slots. Preferably, for each slave unit 6, the secondary processor 6S can be set for transmitting data through the multipolar cable 8 only within the respective time slot.

This makes a particularly effective data transmission possible between the slave units 6 and the master unit 7, which guarantees a response within a clear time frame. This is particularly advantageous in order to deal with the need to transfer data in real time in in-process checking systems. Moreover, unlike prior art systems wherein the master unit interrogates the slave unit each time (using the "polling" technique), this solution allows a drastic reduction in the time necessary for the master unit 7 to collect data stored by the slave units 6, because the latter do not wait to be interrogated by the master unit 7 (this interrogation occupies band width and slows down the communication), but transmits autonomously within its own time slot.

In a further example embodiment, the main processor 7S is programmed to assign to each slave unit 6 a unique identification code and it is programmed to perform a continuous data collection cycle.

The main processor 7S, in every data transmission time interval, is configured to receive and store the data transmitted from the corresponding slave unit 6. The main processor 7S is also configured for associating the data with the slave unit 6 which they come from.

As regards a step of configuring the system wherein the master unit assigns identification codes, attention is drawn to the following.

In an embodiment, each slave unit 6 (and, if necessary, the ancillary units 10 equipped with processing means) has a first and a second switch; the first switch is positioned between the first socket 6B and the processor, the second switch is positioned between the second socket 6C and the processor. The first and second switches could be conventional electrical switches, but preferably they are electronic switches that are made by means of appropriate circuits and can be actuated via software (for example from the sockets 6B, 6C).

At the start of the step of configuring the system 1, for each slave unit 6 (and for the ancillary units 10 equipped with processing means), the first switch is set in the closed position and the second switch is set up in the open position.

In the case of the multiple connector 16, it has a first, a second and a third switch; in this case the first switch is set in the closed position and the second and the third switches are set in the open position.

It is important to carefully position the first switches always facing towards the master unit 7; consequently, the second switches are positioned facing away from the master unit 7.

After the step of arranging the network of the system 1, comprising the slave units 6 (and the ancillary units 10), which are connected in series to the master unit 7 in a chain configuration, in particular of the 'daisy chain' type, the step of configuring the system is started, for example by means of the procedure which follows.

The master unit 7 sends a (first) signal, through the multipolar cable 8, towards the first slave unit 6 of the chain defined by the system 1; the signal constitutes an interrogation and is received by the processor of the (first) slave unit 6 through the corresponding first switch (the signal does not continue further because the second switch of the first slave unit 6 is open). The processor replies to the interrogation (because the slave unit 6 is programmed to provide the response to the interrogation) by providing details regarding its existence and the function of the slave unit 6. The master unit 7 receives the response, records it and stores the position and the function of the slave unit 6 and assigns to the slave unit 6 a unique identification code. Moreover, the slave unit 7 transmits a control signal to the processor of the (first) slave unit 6, for switching the second switch from the open position to the closed position.

Subsequently, the master unit 7 sends a (second) signal through the multipolar cable 8, which, like the first one, constitutes an interrogation for a processor. The signal is received by the processor of the second slave unit 6 (the first slave unit downstream with respect to the first slave unit 6) through the corresponding first switch (the signal does not continue further because the second switch of the second slave unit 6 is open).

The operation is thus iteratively repeated for all the other slave units 6 until a unique identification code has been assigned to each slave unit.

According to an alternative embodiment, it is sufficient for the slave unit 6 to comprise at least one switch, in particular the second switch positioned facing away from the master unit 7. Indeed, in an embodiment of the invention, the first switch mentioned above may remain closed and be replaced by a permanent electrical connection.

In a further embodiment, the main processor 7S is programmed to divide the data transmission time interval into a number of time slots greater than the number of slave units 6 of the system 1, saving at least one additional or extra time slot (in addition to the time slots corresponding to respective slave units 6 and uniquely assigned to them). Preferably, in the additional time slot of the continuous data collection cycle, the main processor 7S is programmed to set parameters of the slave units 6 through the multipolar cable 8. For example, the main processor 7S is programmed to re-set valid parameters for the slave units 6, such as, for example, the duration of the data transmission time interval, and/or to perform the downloading of a digital document in the processor of the slave unit 6. The additional time interval can also be exploited by using, for example, a file transfer protocol such as FTP.

In an embodiment, the master unit 7 comprises a diagnostic block having electronic circuits. The diagnostic block is configured for detecting or collecting, for the slave units 6 and/or for the master unit 7, at least one power supply parameter, representing a supply voltage. The diagnostic block is configured for collecting, in addition or alternatively to the power supply parameter, for each slave unit 6 and/or for the master unit 7, an internal temperature.

A temperature sensor may be present in each slave unit 6 and/or in the master unit 7 for providing a value relative to the internal temperature.

In an embodiment, the diagnostic block of the master unit 7 is configured to collect, for the slave units 6 and/or for the master unit 7, one or more of the following parameters: power supply voltage, electrical current draw, power draw.

In other words, the diagnostic block can detect or collect at least one power supply parameter relative to the entire system (that is, the slave units 6 and the master unit), only to the master unit 7 or to each slave unit 6. The diagnostic block is also able to collect, alternatively or in addition to the power supply parameter, a temperature inside the single slave unit 6 and/or the master unit 7.

Preferably, the diagnostic block of the master unit 7 is programmed for storing data representing a trend over time of the power supply parameter and/or the internal temperature detected.

In an embodiment, the diagnostic block of the master unit 7 has stored in its memory one or more reference values of the power supply parameter and/or internal temperature. The diagnostic block is programmed to compare values, preferably detected in real time, of the power supply parameter and/or internal temperature with the reference values. The diagnostic block is preferably programmed to generate an alarm depending on the comparison carried out. For example, the diagnostic block is programmed to generate an alarm if the internal temperature exceeds a reference value for a predetermined time. In an embodiment, the diagnostic block is programmed to generate an alarm if the power supply parameter differs from a reference value for a predetermined time.

In an embodiment, the slave unit 6 is programmed to transmit in synchrony to the master unit 7 data relating to the operational signals and data relating to the at least one power supply parameter and/or internal temperature.

The master unit 7 is configured to perform the most complex mathematical operations requested by the various measuring cycles and it has the duty of interpreting and/or combining the information received from the various sensors (by means of the slave units 6), translating them into signals that can be received and processed by the numerical control unit 2 and, generally speaking, it is the only interlocutor (within the system 1) of the numerical control unit 2.

In an embodiment, the system 1 comprises a connector bridge 11 having a first and a second end.

The bridge connector 11 comprises a first connector 11A at the first end and a second connector 11B at the second end. Each of the first and second connectors 11A, 11B comprises electrical contacts and can be coupled to the first or to the second socket of the master unit 7.

In an embodiment, the connector bridge 11 comprises asymmetrically shaped profiles (which define mechanical keys) and the sockets 7A, 7B with which the connector bridge 11 is designed to be coupled have corresponding shaped profiles adapted to cooperate with the shaped profiles of the connector bridge 11 to facilitate the correct positioning of the connector bridge in a step of alignment of these shaped profiles.

In an embodiment, the connector bridge 11 comprises a rim made of insulating material (that is, made of electrical or dielectric insulating material), with a central opening and an edge which can be positioned around the electrical contacts of the first or second connector 11A, 11B. The function of the insulating rim is to prevent accidental short circuits during positioning of the connector bridge 11. In the system 1, the connector bridge 11 has mainly the function of connecting a first and a second unit, in particular the master unit 7 to at least one other unit which defines a supplementary unit 13 equipped with a front wall with at least one socket.

Preferably, the first and second connector 11A, 11B have spring contacts, that is to say, retractable contacts, adapted to touch planar electrical contacts or "pads" of the respective sockets. This makes it possible to annul mechanical clearances and compensate for positioning errors between the units to be connected together.

Preferably, the edge delimiting an area occupied by the spring contacts is raised; this is to protect the contacts in the case of accidental impact.

Moreover, according to the preferred embodiment, the first and second connector 11A, 11B face the same direction (along axes parallel to each other and spaced), located on the same side of the bridge connector. That makes it possible to connect the front of the connector bridge 11 to the units positioned alongside as the first and second connectors 11A, 11B face the front wall of the master unit 7 and the supplementary unit 13 where the respective sockets are defined. This front position of the connector bridge 11 makes it possible to remove the connector bridge 11, and pull out the master unit 7 or a supplementary unit 13, without moving the other unit or the master unit 7 (that is to say, the one which must not be removed).

The bridge connector 11 comprises fastening elements associated with the first and the second connector 11A, 11B with retractable contacts. More specifically, fastening screws are coupled to holes defined in the connector bridge 11 and are inserted in corresponding holes of the front wall where the socket to which the connector 11A, 11B must be coupled is defined, so as to guarantee the correct and stable connection of the connector bridge 11.

Preferably, the connector bridge 11 is equipped with an LED visible from the outside, which light up and visually indicates when the bridge connector is connected.

Preferably, the first and the second connector 11A, 11B of the bridge connector 11 are connected rigidly, for example by means of a main body 11C. Preferably, the first and the second connector 11A, 11B are positioned at a mutual distance D1 which is greater than twice the distance D2 which separates the first socket 7A or the second socket 7B of the master unit 7 from an outer side wall 7D, 7E of the master unit 7.

The supplementary unit 13 may be, for example, a further master unit provided with its own network of slave units or an input/output module of the digital or analogue type or even a slave unit.

Preferably, the supplementary unit 13 has a first socket 13A and a second socket 13B. For example, each of the sockets may comprise planar electrical contacts or "pads" which can be coupled to respective retractable electrical contacts present in the multipolar connectors of the connector bridge 11. In an embodiment the supplementary unit 13 has the shape generically of a parallelepiped and the first socket 13A and the second socket 13B are positioned on opposite sides of a front wall 13C, respectively close to a first outer side wall 13D and a second outer side wall 13E of the supplementary unit 13.

According to a preferred embodiment, the supplementary unit 13 has flat side walls 13D, 13E and a plurality of fins 17' which protrude from the side walls 13D, 13E. Preferably, the fins 17 are parallel to each other and arranged perpendicularly to a bottom wall 13T of the supplementary unit 13. For example, the fins 17' are oriented perpendicularly to fastening elements positioned on a back wall 13F of the supplementary unit.

It should be noted that the fins 17, 17' present on a side wall of the master unit 7 and on a side wall of the supplementary unit 13 cooperate to form cooling ducts 14 arranged vertically which enhance dissipation of the hot air using the so-called "chimney or stack effect" to optimise the heat exchange (that is, the cooling) of the master unit 7 and the supplementary unit 13.

The supplementary unit is also preferably provided with fins at a top surface.

In an embodiment, the multipolar cable 8 comprises at least a first bundle of signal wires, which are intended for a corresponding communication channel and one or more power supply wires.

In an embodiment, the multipolar cable 8 defines a plurality of communication channels, preferably of different rankings in terms of speed and complexity of the communication.

More specifically, the multipolar cable 8 preferably defines a first communication channel (high ranking, for example Ethernet), a second communication channel (intermediate ranking, for example CAN) and a third communication channel (low ranking, for example RS485).

In an embodiment, the multipolar cable 8 comprises a plurality of signal wires, for example four, for the first communication channel; a plurality of signal wires, for example two, for the second communication channel; a plurality of signal wires, for example, two, for the third communication channel.

The first channel is used, for example, for data transmission between the slave units 6 and the master unit 7. The second channel is used, for example, for transmitting data between the ancillary units 10 provided with processing means and the master unit 7 of one or more slave units 6. The third channel is used, for example, for transmitting trigger signals, that is, pulse signals constituting operational commands transmitted by the master unit 7 to the slave units 6 or ancillary units 10.

Moreover, preferably, the conducting multipolar cable 8 comprises one or more wires for transmitting logic type signals.

Moreover, preferably, the multipolar cable 8 comprises one or more wires for distributing electrical power supply in the network of the system 1.

In an embodiment, the multipolar cable 8 comprises a plurality of power supply wires (for example, three) at a first voltage value (for example the positive DC voltage of 24 V), and preferably a further plurality (for example, three) of reference power supply wires (for example GND of the 24 V DC).

The present invention also relates to a method for processing and transmitting data between a numerical control unit 2 adapted to control a machine tool 3 and one or more devices present in the machine tool 3.

According to another aspect, the method comprises the following steps:
transferring operational signals from or to the devices through at least one input channel 4;
processing the operational signals to make control signals available to the numerical control unit 2;
arranging a network including a master unit 7 mounted in an electric switchboard and at least one slave unit 6 connected to each other through a multipolar cable 8;
transferring the operational signals between the devices and the at least one slave unit 6;
transferring data between the at least one slave unit 6 and the master unit 7;
generating, by the master unit 7, a synchronization signal and transmitting the synchronization signal through the multipolar cable 8, in order to synchronize a clock of the at least one slave unit 6 with a clock of the master unit 7.

The term "synchronization signal" may mean, for example, a data packet generated and transmitted inside the communication channel, for example the Ethernet network.

If the network comprises a plurality of slave units 6, the method comprises the following steps:
generating an alternating electric excitation signal by each of two or more of the slave units 6 of the plurality in order to energize measuring transducers of corresponding sensors connected to the slave units 6;
synchronizing the alternating electric excitation signals, based on the synchronized clocks, by means of a correction of a relative phase displacement between the alternating electric excitation signals.

Preferably, the correction of a relative phase displacement between the alternating electric excitation signals is obtained by continuously varying the clock frequency of the slave units 6.

Preferably, the alternating electric excitation signals are sinusoids generated by processing a first and a second digital PWM (pulse width modulation) signals having suitable pulse-duration modulation. More specifically, the processing comprises a sum of the first and second digital signal PWM and a subsequent filtering.

Preferably, the method comprises one or more of the following steps:
assigning corresponding acquisition instants to data acquired by the at least one slave unit 6;
storing data relating to the corresponding operational signal in a data packet for a certain time interval;
transmitting the data packet to the master unit 7 through the multipolar cable 8.

Preferably, if the network comprises a plurality of slave units 6, the method comprises the following steps:
dividing a data transmission time interval into a plurality of time slots and uniquely assigning to each slave unit 6 a corresponding time slot of the plurality of time slots, by the master unit 7;
transmitting data through the multipolar cable 8 within the respective time slot by each slave unit 6.

In an embodiment, the method comprises a configuration step. During the configuration step, the master unit 7 transmits a configuration signal through the multipolar cable 8, to define a unique identification code assigned to the at least one slave unit 6 and to store the code in the memory of the master unit 7.

According to a preferred embodiment, in a network which comprises the slave units 6 which are connected in series and each have at least one switch positioned facing away from the master unit 7, the configuration step comprises a step of assigning to each slave unit 6 a unique identification code, with the following steps:
transmission by the master unit 7 through the multipolar cable 8 of a configuration signal to the first slave unit 6 of the series among the slave units 6 which are still without a unique identification code;
receiving the configuration signal by the slave unit 6, the switch being open;
transmission of a response signal from the slave unit 6 to the master unit 7, in response to the configuration signal;
transmission by the master unit 7 to the slave unit 6 of an assignment signal for setting a unique identification code to the slave unit 6 and to change switch from open to closed; and
repeating the previous steps for all the other slave units 6 which are still without a unique identification code, until the master unit 7 has assigned to each unit a respective unique identification code.

In an embodiment, the step of arranging the network comprises connecting two or more slave units 6 connecting the second socket 6C of a slave unit 6 and the first socket 6B of another slave unit 6.

The mutual connection of two slave units 6 may be performed by connecting directly the respective sockets or by using the multipolar cable 8.

In an embodiment, the step of arranging the network comprises connecting at least one slave unit 6 to one or two ancillary units 10 provided with a first socket 10A and a second socket 10B. The first and second socket 10A, 10B of each ancillary unit 10 is configured to be coupled to a first or a second connector of the multipolar connectors 9 and to one of the first and second sockets 6B, 6C of the slave unit 6. Preferably, an operation of the ancillary unit 10 is controlled by an operation of the slave unit 6 to which it is connected.

If the multipolar cable 8 comprises two or more pieces, each having a first and a second end provided with a multipolar connector 9, the mutual connection of two slave units 6 is carried out by means of one of the pieces.

Preferably, the step of arranging the network comprises making a configuration of the "daisy chain" type.

In an embodiment, the arrangement of the network comprises making a branch, with respect to the configuration of the "daisy chain" type, through a multipolar connector coupled to one of the multipolar connectors 9 of the multipolar cable 8 and/or connected to the first or the second socket 6B, 6C of the slave unit 6.

According to an alternative embodiment, the step of arranging the network comprises connecting a first unit to a second unit, that is to say the master unit 7 to a supplementary unit 13 provided with at least one socket 13A through a bridge connector 11 having a first connector 11A and a second connector 11B which can be coupled to the first or to the second socket 7A, 7B of the master unit 7.

Preferably, the connector bridge 11 is rigid and U-shaped with the two multipolar connectors 11A, 11B placed at the ends.

If the master unit 7 and the supplementary unit 13 each have a first and a second socket (each socket is configured to be coupled to a multipolar connector), the electrical connection of the master unit 7 to the supplementary unit 13 comprises coupling the bridge connector 11 to one of the sockets 7A, 7B of the master unit 7 and to one of the sockets 13A, 13B of the supplementary unit 13.

If the master unit 7 and the supplementary unit 13 are each slidably connectable to a supporting or mounting bar (for example a DIN rail) of an electrical panel, the method comprises a step of connecting the master unit 7 and the supplementary unit 13 to the same supporting bar. Preferably, the master unit 7 and the supplementary unit 13 are positioned alongside of each other.

Subsequently, the master unit 7 and the supplementary unit 13 are connected electrically by means of the bridge connector 11. More specifically, in the preferred embodiment wherein the multipolar connectors are comprise retractable contacts, the electrical connection comprises positioning the bridge connector 11 in such a way that the retractable contacts touch corresponding planar electrical contacts of the sockets of the master unit 7 and the supplementary unit 13, and defining and fixing the position of the bridge connector 11 with respect to to the master unit 7 and the supplementary unit 13 by means of fastening elements.

A step of disconnecting, for example to replace a supplementary unit 13 alongside the master unit 7, comprises removing the fastening elements and unplugging the bridge connector 11 to detach the retractable contacts of the bridge connector 11 from the planar electrical contacts of the sockets of the two units, and removing the unit to be replaced, for example the supplementary unit 13, pulling it from the front without the need to move the master unit 7. This is particularly advantageous when there are several units side by side and electrically connected by connector bridges, and a unit flanked by other units is to be replaced.

The steps for electrical connection and disconnection are part of a method for managing electrical connections according to the invention, which is generally applicable to measuring and/or checking systems.

Preferably, the network comprises at least one slave unit 6 positioned in the work space 3C of the machine tool 3. The master unit 7 and any supplementary unit(s) 13 are generally positioned in an electrical panel.

If the system 1 comprises a plurality of slave units 6, in an embodiment, the method comprises the steps of:
dividing a data transmission time interval into a plurality of time slots and uniquely assigning to each slave unit 6 a corresponding time slot of the plurality of time slots, by the master unit 7;
transferring data from the slave unit 6 to the master unit 7, through the multipolar cable 8, in which the data is transferred from each slave unit 6 only within the respective time slot.

The method preferably comprises the following steps:

assigning, by the master unit 7, a unique identification code associated with each slave unit 6;
performing, by the master unit 7, a continuous data collection cycle in which, at each time slot of the data transmission time interval, the master unit 7 receives and stores the data transmitted by the corresponding slave unit 6 and associates the date with the slave unit 6 from which the data come from.

Preferably, the data transmission time interval is divided into a number of time slots greater than the number of slave units 6 of the system 1, to keep at least one additional or extra time slot (as well as the time slots assigned to the slave units 6) which may be used by the master unit 7 to set parameters, during the continuous data collection cycle, the slave units 6.

It should be noted that, preferably, the data transmission, the electrical power supply of slave unit 6 and the synchronization of the clock of each slave unit 6 with the clock of the master unit 7 are carried out by means of the multipolar cable 8.

In an embodiment, the method comprises a step of acquiring and storing, by the slave unit 6, data corresponding to at least one operational signal received through the input channel 4 (that is, the port 6A) and a step of assigning corresponding acquisition instants to the data acquired.

The method also comprises a step of detecting or collecting, by the master unit 7, at least one power supply parameter (voltage or current, for example) representing the electrical current draw in the entire system, in only the master unit 7 or in each slave unit 6.

Alternatively or in addition, the method also comprises a step for collecting, by the master unit 7, an internal temperature of one or more (preferably all) the slave units 6 and/or the master unit 7.

Preferably, the master unit 7 detects or collects one or more of the following parameters for the slave units 6 and/or for the master unit 7: supply voltage, electrical current draw, absorbed power.

In an embodiment, the method comprises a step of comparing detected parameters of power supply and/or internal temperature with reference values. Preferably, the method also comprises a step of generating alarm signals as a function of such comparison.

Preferably, the at least one slave unit 6 transfers in synchrony to the master unit 7 data relating to the operational signals and data relating to the power supply parameter and/or to the internal temperature.

In an embodiment, the multipolar cable 8 has at least one connectorless end, that is one end without a connector (a free end).

A method according to the present invention to connect, in a generic measuring and/or checking system, at least a first and a second unit using the multipolar cable 8 comprises the following steps:
positioning the multipolar cable;
coupling a fast wiring multipolar connector to the end of the multipolar cable without connector; and
coupling the fast wiring multipolar connector to one of the first and second units.

According to a preferred application, where the measuring and/or checking system is applied to a machine tool, the step of positioning the multipolar cable comprises the insertion of the end without a connector in a machine cable carrying duct of the machine tool 3 and, after the insertion, a step of coupling a fast wiring multipolar connector 12 to the free end.

Preferably, the coupling of the fast wiring multipolar connector 12 to the free end of the multipolar cable 8 comprises a step of perforating the insulating sheath which covers the sheathed wires 8A contained in the multipolar cable 8, by means of perforating electrical contacts 12P present in the fast wiring multipolar connector 12.

The fast wiring multipolar connector 12 is then connected to the master unit 7. The master unit 7 is positioned in the space 3D of the electrical panel. The end with a pre-assembled multipolar connector of the multipolar cable 8 is positioned in the work space 3C.

The end with a pre-assembled multipolar connector of the multipolar cable 8 is connected to a slave unit 6. Preferably, other slave units 6 and/or ancillary units 10 are connected to the slave unit 6, either directly or by means of further pieces of multipolar cable 8. Preferably, other slave units 6 and/or ancillary units 10 are positioned in the work space 3C of the machine tool 3.

The invention claimed is:

1. A measuring and/or control system, comprising:
   at least a first and a second unit, each unit comprising a casing with a front wall, electronic circuits and at least one socket; and
   a bridge connector having a first multipolar connector and a second multipolar connector, the first multipolar connector and the second multipolar connector each being adapted to be coupled to one of said sockets in order to electrically connect the first and the second unit;
   wherein
   in each of said first and the second units, said at least one socket is positioned on the respective front wall and comprises planar electrical contacts,
   the first and the second multipolar connectors of the bridge connector are directed in the same direction so as to face the front wall of the first unit and the second unit and each multipolar connector comprises retractable contacts, and
   the bridge connector comprises fastening elements for fastening the bridge connector to the front wall of the first unit and of the second unit.

2. The system according to claim 1, wherein the first and second multipolar connectors of the bridge connector are rigidly connected to each other and are positioned at a distance from each other which is more than twice a distance which separates said at least one socket of one of the first and the second unit from an outer side wall of the same of said first and second units.

3. The system according to claim 1, wherein the first unit and the second unit each comprise two sockets located on opposite sides of the respective front wall, at the same height and next to corresponding outer side walls of the unit itself.

4. The system according to claim 1, wherein the bridge connector is rigid and U-shaped and each of the two multipolar connectors is located at an end thereof.

5. The system according to claim 1, wherein the bridge connector has at least one rim made of electrically insulating material with a central opening and an edge configured to be positioned around the electrical contacts of one of said first and second multipolar connectors.

6. The system according to claim 1, wherein the bridge connector comprises asymmetrically shaped profiles and the sockets of said first and second units comprise matching shaped profiles adapted to cooperate with the shaped profiles of the bridge connector to facilitate the correct positioning of the bridge connector.

7. The system according to claim 1, further comprising a multipolar cable having a first and a second end, each end provided with a multipolar connector adapted to be coupled to the sockets of the first and second units, and wherein at least one of said first and second units comprises at least one input channel adapted to transmit operational signals from or to devices present in the machine tool and electronic circuits configured to process said operational signals.

8. The system according to claim 7, wherein the other of said first and second units defines an input/output module, of the digital or analogic type.

9. The system according to claim 8, wherein said first and second units define a master unit and a supplementary unit, the master unit comprising an output interface, a main processor, a memory and a first and a second socket, each adapted to be coupled to one of the multipolar connectors of the multipolar cable, the system further comprising at least one slave unit provided with at least one external port defining the input channel, a memory, a secondary processor, and provided with a first socket and a second socket, adapted to be coupled at least to a first or a second connector of said multipolar connectors of the multipolar cable in order to interconnect the slave unit at least with the master unit.

10. The system according to claim 7, wherein the multipolar cable comprises:
    at least a first bundle of signal wires for a corresponding communication network; and
    one or more power wires.

11. A method for managing electrical connections in a measuring and/or control system comprising at least a first and a second unit, each comprising a casing with a front wall, electronic circuits and at least one socket positioned on the respective front wall and comprising planar electrical contacts, and a bridge connector having a first multipolar connector and a second multipolar connector both directed in the same direction so as to face the front wall of the first unit and the second unit and each comprising retractable contacts and fastening elements for fastening said bridge connector to the front wall of the first unit and of the second unit, the method comprising a step of electrically connecting the first and second units to each other by the following steps:
    positioning the bridge connector such that the retractable contacts touch the planar electrical contacts of the first and second units; and
    defining and fixing the position of the bridge connector with respect to the first unit and the second unit using the fastening elements.

12. The method according to claim 11, wherein the bridge connector comprises asymmetrically shaped profiles to facilitate the correct positioning of the bridge connector and the sockets of the first and second units comprise matching shaped profiles, wherein the step of defining and fixing the position of the bridge connector comprises a step of aligning the shaped profiles of the bridge connector with the matching shaped profiles of the sockets of the first and second units.

13. The method according to claim 11, further comprising a step of disconnecting the first unit and the second unit from each other by the following steps:
    removing the fastening elements and unplugging the bridge connector to detach the retractable contacts of the bridge connector from the planar electrical contacts of the socket of the first unit and of the socket of the second unit; and
    removing the first or the second unit by pulling it from the front wall without having to move the other unit.

14. The method according to claim 11, wherein the first and second units are slidably connectable to a mounting bar of an electric switchboard, wherein the method comprises a step of mechanically connecting the first unit and the second unit to said bar and positioning one unit alongside the other unit before said step of electrically connecting them to each other.

\* \* \* \* \*